(12) United States Patent
Sun et al.

(10) Patent No.: US 9,112,514 B2
(45) Date of Patent: Aug. 18, 2015

(54) HIGH-PRECISION OSCILLATOR

(71) Applicant: IPGoal Microelectronics (Sichuan) Co., Ltd., Chengdu (CN)

(72) Inventors: Weihong Sun, Chengdu (CN); Zhengxian Zou, Chengdu (CN)

(73) Assignee: IPGOAL MICROELECTRONICS (SICHUAN) CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/459,291

(22) Filed: Aug. 13, 2014

(65) Prior Publication Data

US 2015/0137897 A1 May 21, 2015

(30) Foreign Application Priority Data

Nov. 18, 2013 (CN) .......................... 2013 1 0576652

(51) Int. Cl.
*H03K 3/011* (2006.01)
*H03K 3/03* (2006.01)
*H03L 1/00* (2006.01)
*H03L 1/04* (2006.01)

(52) U.S. Cl.
CPC *H03L 1/04* (2013.01); *H03K 3/011* (2013.01); *H03K 3/0322* (2013.01); *H03L 1/00* (2013.01)

(58) Field of Classification Search
CPC ... H03K 3/011; H03K 3/0315; H03K 3/0322; H03K 3/354; H03K 5/132; H03K 5/133; H03L 1/00; H03L 1/02; H03L 1/022; H03L 7/0995
USPC ....................... 331/45, 57, 175, 176, 185, 186
See application file for complete search history.

(56) References Cited

U.S. PATENT DOCUMENTS

| | | | | |
|---|---|---|---|---|
| 5,412,349 | A * | 5/1995 | Young et al. | 331/34 |
| 5,499,214 | A * | 3/1996 | Mori et al. | 365/222 |
| 5,748,048 | A * | 5/1998 | Moyal | 331/34 |
| 5,847,616 | A * | 12/1998 | Ng et al. | 331/57 |
| 7,388,447 | B1 * | 6/2008 | Potanin et al. | 331/185 |
| 2003/0214361 | A1 * | 11/2003 | Nishikido | 331/57 |
| 2005/0030109 | A1 * | 2/2005 | Kim | 331/16 |
| 2006/0082419 | A1 * | 4/2006 | Sakaguchi | 331/57 |
| 2006/0226921 | A1 * | 10/2006 | Hsu | 331/57 |
| 2007/0146072 | A1 * | 6/2007 | Ohta et al. | 330/253 |
| 2008/0084249 | A1 * | 4/2008 | Noguchi | 331/66 |
| 2009/0160562 | A1 * | 6/2009 | Huang | 331/57 |
| 2010/0171558 | A1 * | 7/2010 | Kim et al. | 331/57 |

\* cited by examiner

*Primary Examiner* — Levi Gannon
(74) *Attorney, Agent, or Firm* — Shimokaji & Associates, P.C.

(57) ABSTRACT

A high-precision oscillator includes a voltage reference module which includes multiple measured Field Effect Transistors and arranged for detecting process corners for the measured Field Effect Transistors to generate a reference voltage containing process corner information of the measured Field Effect Transistors, a compensation current generating module which is arranged for receiving the reference voltage, making a temperature compensation for the reference voltage, and generating a compensation current which includes both the process compensation and temperature compensation, and a ring oscillator which is arranged for receiving the compensation current and outputting a clock with stable frequency. The high-precision oscillator designs the process compensation and the temperature compensation separately, which are adjustable due to one of them will not be influenced by the other; and frequency of its outputted clock is not influenced by process and temperature, thereby precision of the outputted clock is improved.

7 Claims, 2 Drawing Sheets

HIGH-PRECISION OSCILLATOR

RELATED APPLICATIONS

This application claims the benefit of priority to Chinese Patent Application No. 201310576652.5, filed on Nov. 18, 2013, which is hereby incorporated by reference in its entirety.

FIELD OF THE INVENTION

The present invention relates to a technical field of analog circuit oscillators, and more specifically to a high-precision oscillator.

BACKGROUND OF THE INVENTION

Existing oscillators usually have process compensation, but without temperature compensation generally, so the frequency of the oscillators will vary with the temperature in practice, which is so-called temperature drift, to result in a lower precision of the outputted clock. Since the process compensation and the temperature compensation are restricted with each other, thus it's hard for the existing oscillators to design the process compensation and the temperature compensation separately, thereby the existing oscillators are hard to adjust and unable to meet a need for both the process compensation and the temperature compensation.

Therefore, it is necessary to provide an improved high-precision oscillator to overcome above drawbacks.

SUMMARY OF THE INVENTION

An objective of the present invention is to provide a high-precision oscillator in which both the process compensation and the temperature compensation are existed individually, the both are adjustable due to one of them will not be influenced by the other; and frequency of its outputted clock is not influenced by process and temperature, thereby precision of the outputted clock is improved.

To achieve the objective, a high-precision oscillator includes a voltage reference module, a compensation current generating module and a ring oscillator; and the voltage reference module comprises multiple measured Field Effect Transistors, arranged for detecting process corners for the measured Field Effect Transistors to generate a reference voltage which contains process corner information of the measured Field Effect Transistors, and inputting the reference voltage to the compensation current generating module; and the compensation current generating module is arranged for making a temperature compensation for the reference voltage, generating a compensation current which simultaneously possesses process compensation and temperature compensation, and inputting the compensation current to the ring oscillator; and the ring oscillator is arranged for receiving the compensation current generated by the compensation current generating module, and outputting a clock having stable frequency according to the compensation current.

Preferably, the voltage reference module comprises a first Field Effect Transistor, a second Field Effect Transistor, a third Field Effect Transistor, a fourth Field Effect Transistor, a fifth Field Effect Transistor, a sixth Field Effect Transistor, a seventh Field Effect Transistor, an eighth Field Effect Transistor, a first resistor and a second resistor; gates and drains of the first Field Effect Transistor, the second Field Effect Transistor and the third Field Effect Transistor are grounded, and a source of the first Field Effect Transistor is connected with a source of the seventh Field Effect Transistor, a source of the second Field Effect Transistor is connected with one terminal of the first resistor, a source of the third Field Effect Transistor is connected with one terminal of the second resistor, and the first Field Effect Transistor, the second Field Effect Transistor and the third Field Effect Transistor are the measured Field Effect Transistors so as to provide the process corner information of the Field Effect Transistors; sources of the fourth Field Effect Transistor, the fifth Field Effect Transistor and the sixth Field Effect Transistor are connected with an external power source, and their gates are jointly connected to a drain of the fifth Field Effect Transistor, a drain of the fourth Field Effect Transistor is connected with a drain of the seventh Field Effect Transistor, a drain of the fifth Field Effect Transistor is connected with a drain of the eighth Field Effect Transistor, and a drain of the sixth Field Effect Transistor is connected with the other terminal of the second resistor to output the reference voltage; a gate and a drain of the seventh Field Effect Transistor are connected together which are also connected with a gate of the eighth Field Effect Transistor, and a source of the eighth Field Effect Transistor is connected with the other terminal of the first resistor.

Preferably, a width/length ratio of the fifth Field Effect Transistor is the same as that of the sixth Field Effect Transistor.

Preferably, the compensation current generating module comprises a ninth Field Effect Transistor, a tenth Field Effect Transistor, an eleventh Field Effect Transistor, a twelfth Field Effect Transistor, and an operational amplifier; a gate and a drain of the ninth Field Effect Transistor are grounded, a source of the ninth Field Effect Transistor is connected with an inverting input terminal of the operational amplifier and a source of the tenth Field Effect Transistor respectively; and a non-inverting input terminal of the operational amplifier is connected with an output terminal of the voltage reference module, and an output terminal of the operational amplifier is connected with a gate of the tenth Field Effect Transistor; a drain of the tenth Field Effect Transistor, and a drain and a gate of the eleventh Field Effect Transistor are jointly connected to a gate of the twelfth Field Effect Transistor; sources of the eleventh Field Effect Transistor and the twelfth Field Effect Transistor are connected with the external power source; and the compensation current which includes both the process compensation and the temperature compensation is outputted from a drain of the twelfth Field Effect Transistor.

Preferably, the width/length ratio of the eleventh Field Effect Transistor is the same as that of the twelfth Field Effect Transistor.

Preferably, the compensation current generating module comprises a ninth Field Effect Transistor, a tenth Field Effect Transistor, an eleventh Field Effect Transistor, a twelfth Field Effect Transistor, and an operational amplifier; a gate and a drain of the ninth Field Effect Transistor are grounded, a source of the ninth Field Effect Transistor is connected with an inverting input terminal of the operational amplifier and a source of the tenth Field Effect Transistor; and a non-inverting input terminal of the operational amplifier is connected with an output terminal of the voltage reference module, and an output terminal of the operational amplifier is connected with a gate of the tenth Field Effect Transistor; a drain of the tenth Field Effect Transistor, and a drain and a gate of the eleventh Field Effect Transistor are jointly connected to a gate of the twelfth Field Effect Transistor; sources of the eleventh Field Effect Transistor and the twelfth Field Effect Transistor are connected with the external power source; and the compensation current is outputted from a drain of the twelfth Field Effect Transistor; and the ninth Field Effect Transistor, the first Field Effect Transistor, the second Field Effect Transistor and the third Field Effect Transistor are P-type Field Effect Transistors.

Preferably, the ring oscillator comprises a thirteenth Field Effect Transistor, a fourteenth Field Effect Transistor, a fifteenth Field Effect Transistor, a comparator and multiple oscillation units; a drain and a gate of the thirteenth Field Effect Transistor, and a gate of the fourteenth Field Effect Transistor are jointly connected to an output terminal of the compensation current generating module, sources of the thirteenth Field Effect Transistor and the fourteenth Field Effect Transistor are grounded; a drain of the fourteenth Field Effect Transistor is connected with a drain of the fifteenth Field Effect Transistor; the drain and a gate of the fifteenth Field Effect Transistor are jointly connected to each oscillation unit, and a source of the fifteenth Field Effect Transistor is connected with the external power source; all the oscillation units are connected in series in order, and an output terminal of the last oscillation unit is connected with an input terminal of the first oscillation unit, and two output terminals of the last oscillation unit are connected with two input terminals of the comparator respectively, and the clock with stable frequency is outputted from an output terminal of the comparator.

According to the high-precision oscillator of the present invention, the voltage reference module includes multiple measured Field Effect Transistors and is arranged for detecting process corners for the measured Field Effect Transistors to generate a reference voltage which contains process corner information of the measured Field Effect Transistors, and inputting the reference voltage to the compensation current generating module; and then the compensation current generating module makes a temperature compensation for the reference voltage, and generates a compensation current which includes both process compensation and temperature compensation and is inputted to the ring oscillator; thereby the process compensation and temperature compensation in the high-precision oscillator are configured individually, both of which are adjustable due to one of them will not be influenced by the other; and since the outputted clock is undergone the process compensation and temperature compensation simultaneously, so the frequency of the outputted clock will not be influenced by process and temperature, thereby precision of the outputted clock is improved.

The present invention will become more apparent from the following detailed description when taken in conjunction with the accompanying drawings used to illustrate embodiments of the invention.

DETAILED DESCRIPTION OF ILLUSTRATED EMBODIMENTS

Figure 1:
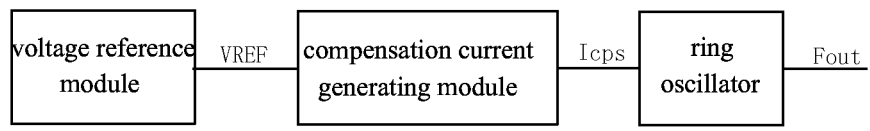
FIG. 1 is a system diagram of the high-precision oscillator according to the present invention.

Preferred embodiments of the present invention will be described taking in conjunction with the accompanying drawings below, and a similar component label in the drawings refers to a similar component. As noted above, the present invention provides a high-precision oscillator in which both the process compensation and the temperature compensation are existed individually, the both are adjustable due to one of them will not be influenced by each other, thereby it's easier to adjust; and frequency of its outputted clock is not influenced by process and temperature, thereby precision of the outputted clock is improved.

Please refer to FIG. 1, FIG. 1 is a system diagram of the high-precision oscillator according to the present invention. As shown in FIG. 1, the high-precision oscillator of the present invention includes a voltage reference module, a compensation current generating module and a ring oscillator; and the voltage reference module is arranged for generating a reference voltage VREF which contains process corner information of the measured Field Effect Transistors, and inputting the reference voltage VREF to the compensation current generating module; the compensation current generating module is arranged for making a temperature compensation for the reference voltage VREF, generating a compensation current Icps which includes both process compensation and temperature compensation, and inputting the generated compensation current Icps to the ring oscillator; and the ring oscillator is arranged for receiving the compensation current Icps generated by the compensation current generating module, and outputting a clock Fout with stable frequency.

Figure 2:
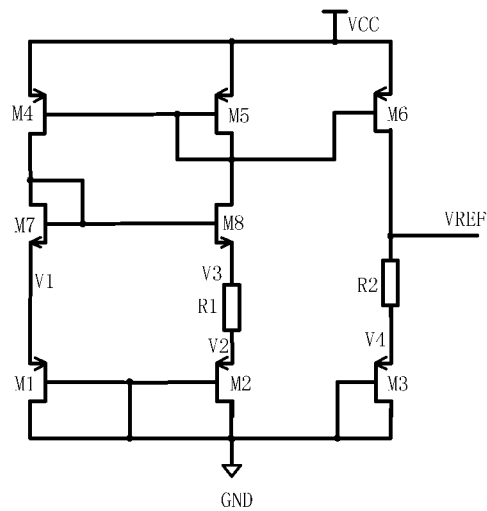
FIG. 2 is a circuit diagram of the voltage reference module showed in FIG. 1.

Please refer to FIG. 2 by combination with FIG. 1, FIG. 2 is a circuit diagram of the voltage reference module showed in FIG. 1. As shown in figures, the voltage reference module includes a first Field Effect Transistor (FET) M1, a second FET M2, a third FET M3, a fourth FET M4, a fifth FET M5, a sixth FET M6, a seventh FET M7, an eighth FET M8, a first resistor R1 and a second resistor R2; gates and drains of the first FET M1, the second FET M2 and the third FET M3 are grounded, and a source of the first FET M1 is connected with a source of the seventh FET M7, a source of the second FET M2 is connected with one terminal of the first resistor R1, a source of the third FET M3 is connected with one terminal of the second resistor R2, and the first FET M1, the second FET M2 and the third FET M3 are the measured FETs so as to provide the process corner information of the FETs; sources of the fourth FET M4, the fifth FET M5 and the sixth FET M6 are connected with an external power source VCC, and their gates are jointly connected to a drain of the fifth FET M5, a drain of the fourth FET M4 is connected with a drain of the seventh FET M7, the drain of the fifth FET M5 is connected with a drain of the eighth FET M8, a drain of the sixth FET M6 is connected with the other terminal of the second resistor R2, arranged for outputting the reference voltage VREF; a gate and a drain of the seventh FET M7 are connected together which are also connected with a gate of the eighth FET M8, and a source of the eighth FET M8 is connected with the other terminal of the first resistor R1. In preferred embodiments of the present invention, the width/length ratio of the fifth FET M5 is the same as that of the sixth FET M6.

Concretely, the voltage reference module realizes the detection of process corners for the first FET M1, the second FET M2 and the third FET M3 by comparing their gate voltages to get a compare result which contains the process corner information. And an operational amplifier is formed by the fourth FET M4, the fifth FET M5, the seventh FET M7 and the eighth FET M8, arranged for making the voltage V1 be equal to the voltage V3, and making the current flowing through the fifth FET M5 be mirrored to the sixth FET M6 at the same time, and the current flowing through the fifth FET M5 is set as I. And the first resistor R1 converts the voltage difference VR (namely the voltage difference between the voltage V1 and the voltage V3) between its two terminals to the current I which obviously contains the process corner information of the first FET M1 and the second FET M2; the second resistor R2 and the third FET M3 receive the current flowing through the sixth FET M6, and then convert it to the reference voltage VREF which is consist by the current I containing the process corner information of the first FET M1 and the second FET M2 and gate voltage of the third FET M3, thus the reference voltage VREF contains the process corner information of the first FET M1, the second FET M2 and the third FET M3. Concretely:

the gate voltage V1 of the first FET M1 and the gate voltage V2 of the second FET M2 are:

$$V1 = Vth + \sqrt{\frac{2I}{Cox*up*(W/L)_1}};$$

$$V2 = Vth + \sqrt{\frac{2I}{Cox*up*(W/L)_2}};$$

and since V1=V3, then the voltage difference VR between two terminals of the first resistor R1 is:

$$VR = V3 - V2 = \sqrt{\frac{2I}{Cox*up}} * \left(\sqrt{\frac{1}{(W/L)_1}} - \sqrt{\frac{1}{(W/L)_2}}\right);$$

then:

$$VR = I*R1 = \sqrt{\frac{2I}{Cox*up}} * \left(\sqrt{\frac{1}{(W/L)_1}} - \sqrt{\frac{1}{(W/L)_2}}\right);$$

so the current I can be obtained as:

$$I = \frac{2}{Cox*up*R1} * \left(\sqrt{\frac{1}{(W/L)_1}} - \sqrt{\frac{1}{(W/L)_2}}\right)^2.$$

Since the width/length ratio of the fifth FET M5 is the same as that of the sixth FET M6, thus the current flowing through the sixth FET M6 is I, and then the gate voltage V4 of the sixth FET M6 is:

$$V4 = Vth + \frac{2}{Cox*up} * \sqrt{\frac{1}{R1*(W/L)_3}} * \left(\sqrt{\frac{1}{(W/L)_1}} - \sqrt{\frac{1}{(W/L)_2}}\right);$$

thereby the outputted reference voltage VREF is:

$$VREF = V4 + I*R2 =$$

$$Vth + \frac{2}{Cox*up} * \sqrt{\frac{1}{R1*(W/L)_3}} * \left(\sqrt{\frac{1}{(W/L)_1}} - \sqrt{\frac{1}{(W/L)_2}}\right) +$$

$$\frac{2}{Cox*up} * \frac{R2}{R1}\left(\sqrt{\frac{1}{(W/L)_1}} - \sqrt{\frac{1}{(W/L)_2}}\right)^2;$$

and if set:

$$\alpha = \sqrt{\frac{1}{R1*(W/L)_3}} * \left(\sqrt{\frac{1}{(W/L)_1}} - \sqrt{\frac{1}{(W/L)_2}}\right),$$

$$\beta = \frac{R2}{R1}\left(\sqrt{\frac{1}{(W/L)_1}} - \sqrt{\frac{1}{(W/L)_2}}\right) \text{ then:}$$

$$VREF = Vth + \frac{2}{Cox*up} * (\alpha + \beta).$$

To be noted, Vth refers to a threshold voltage of the first FET M1, the second FET M2 and the third FET M3, Cox refers to gate capacitance per unit, up refers to electron mobility, α and β are constants, W/L refers to the width/length ratio of corresponding FETs. If the process corner of the FETs is in a slow process, then Vth is increased, and Cox is decreased, thereby the reference voltage VREF is increased accordingly; otherwise, if the process corner of the FETs is in a fast process, then Vth is decreased, and Cox is increased, thereby the reference voltage VREF is decreased accordingly. Thus it can be seen that variations of the reference voltage VREF reflects process changes of the FETs; at the same time, Vth is a positive temperature coefficient, and up is a negative temperature coefficient, so the reference voltage VREF has no relationship with the temperature, thus it doesn't change with the temperature, that is the reference voltage VREF only reflects process corner changes, which provides a process compensation for the FETs.

Figure 3:
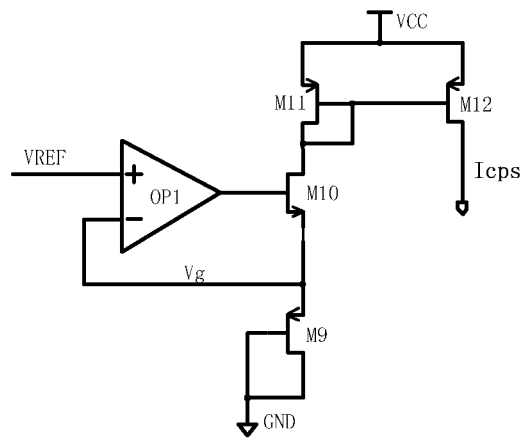
FIG. 3 is a circuit diagram of the compensation current generating module showed in FIG. 1.

Please refer to FIG. 3 by combination with above figures, the compensation current generating module of the high-precision oscillator according to the present invention includes a ninth FET M9, a tenth FET M10, an eleventh FET M11, a twelfth FET M12, and an operational amplifier OP; a gate and a drain of the ninth FET M9 are grounded, a source of the ninth FET M9 is connected with an inverting input terminal of the operational amplifier OP and a source of the tenth FET M10 respectively; a non-inverting input terminal of the operational amplifier OP is connected with an output terminal of the voltage reference module (that is the drain of the sixth FET M6), and an output terminal of the operational amplifier OP is connected with a gate of the tenth FET M10; a drain of the tenth FET M10, and a drain and a gate of the eleventh FET M11 are jointly connected to a gate of the twelfth FET M12; sources of the eleventh FET M11 and the twelfth FET M12 are connected with the external power source VCC; and the compensation current Icps which includes both the process compensation and the temperature compensation is outputted from a drain of the twelfth FET M12. In preferred embodiments of the present invention, the width/length ratio of the eleventh FET M11 is the same as that of the twelfth FET M12.

Concretely, in the compensation current generating module, a negative feedback loop is formed by the operational amplifier OP and the tenth FET M10, which forces the voltage Vg of the operational amplifier OP's inverting input terminal be equal to the reference voltage VREF; and when the entire high-precision oscillator works, the ninth FET M9 generates the current I1, and it can be seen from FIG. 3 that the current flowing through the eleventh FET M11 is equal to the current I1; and since the width/length ratio of the eleventh FET M11 is the same as that of the twelfth FET M12, thus the twelfth FET M12 can mirror the current I1 flowing through the eleventh FET M11 in a ratio of 1:1, and output the mirrored current I1 which is actually the compensation current Icps outputted from the compensation current generating module.

And the compensation current Icps is equal to the current I1 flowing through the ninth FET M9. Specific reasons are as following:

Because of existence of the negative feedback loop, Vg=VREF, and further because the voltage Vg is the gate voltage of the ninth FET M9, thus the current generated by the ninth FET M9 is:

$$I1 = \frac{1}{2} * Cox * \text{up} * (W/L)_9 * (VREF - Vth9)^2$$

$$= \frac{1}{2} * Cox * \text{up} * (W/L)_9 * \left(Vth9 - Vth + \frac{2}{Cox * \text{up}} * (\alpha + \beta)\right)^2$$

Since the ninth FET M9, the first FET M1, the second FET M2 and the third FET M3 are P-type FETs, thus the threshold voltage Vth9 of the ninth FET M9 is equal to the threshold voltage Vth of the third FET M3, which can be cancelled in the above formula directly, thereby the above formula may be changed to:

$$I1 = \frac{2}{Cox * \text{up}} * (W/L)_9 * (\alpha + \beta)^2$$

To be noted, $(W/L)_9$ means the width/length ratio of the ninth FET M9. And since $\alpha$ and $\beta$ are constants, if set $\epsilon = 2*(\alpha+\beta)^2$, then:

$$I1 = Icps = \varepsilon * (W/L)_9 * \frac{1}{Cox * \text{up}}.$$

Figure 4:
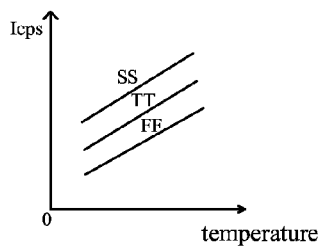
FIG. 4 is a characteristic diagram of the current outputted from the compensation current generating module showed in FIG. 3 that varies with the process and temperature of the Field Effect Transistors.

Above formula shows that if the process corner of the FETs is in a slow process, Cox is decreased, and then the current I1 is increased accordingly; otherwise, if the process corner of the FETs is in a fast process, Cox is increased, and then the current I1 is decreased, so the current I1 reflects the process corner changes. And because up is a negative temperature coefficient, and the current I1 is inversely proportional to up as showed in the above formula, thus the current I1 is a positive temperature coefficient, thereby realizing a temperature compensation for the current I1, and the compensation current Icps contains change information (referring to Cox and up which reflect process corner changes of the FETs) of the process. At the same time, the temperature coefficient of the current I1 may be adjusted by adjusting the width/length ratio $(W/L)_9$ of the ninth FET M9. Then it can be seen that the compensation current generating module provides a temperature compensation (positive temperature compensation) for the outputted compensation current Icps, and it can adjust the temperature coefficient of the compensation current Icps by adjusting the width/length ratio $(W/L)_9$ of the ninth FET M9; moreover, since the reference voltage VREF outputted from the voltage reference module contains process information, so the compensation current Icps also contains process information, and has different values under different processes. The characteristics of the compensation current Icps is showed in FIG. 4, therein SS means a slow process corner, FF means a fast process corner, and TT means a middle process corner.

Figure 5:
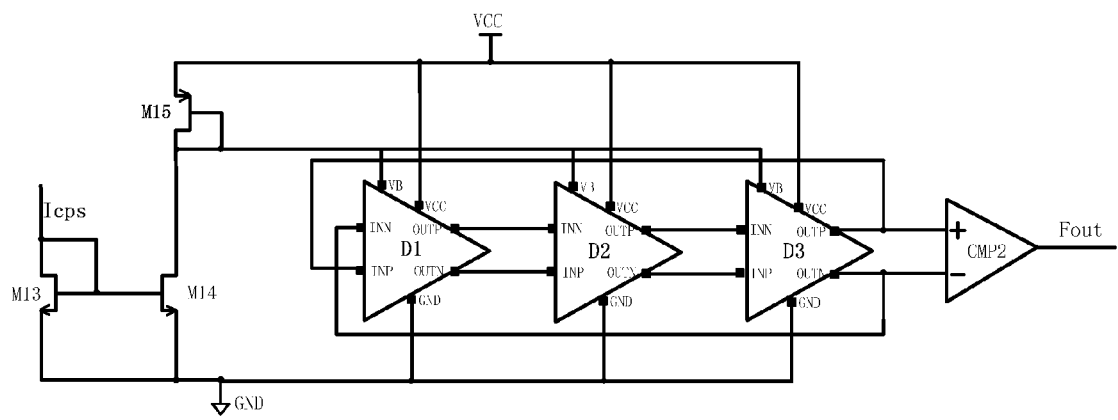
FIG. 5 is a circuit diagram of the ring oscillator showed in FIG. 1.

Please refer to FIG. 5 by combination with above figures, the ring oscillator of the high-precision oscillator according to the present invention includes a thirteenth FET M13, a fourteenth FET M14, a fifteenth FET M15, a comparator CMP and multiple oscillation units. In preferred embodiments of the present invention, the ring oscillator includes three oscillation units, respectively are D1, D2, and D3, of course amount of the oscillation unit is not limited to this. Concretely, a drain and a gate of the thirteenth FET M13, and a gate of the fourteenth FET M14 are jointly connected to an output terminal (namely the drain of the twelfth FET M12) of the compensation current generating module, sources of the thirteenth FET M13 and the fourteenth FET M14 are grounded; a drain of the fourteenth FET M14 is connected with a drain of the fifteenth FET M15; the drain and the gate of the fifteenth FET M15 are jointly connected, which are also connected with each oscillation unit, and a source of the fifteenth FET M15 is connected with the external power source VCC; all the oscillation units are connected in series in order, and an output terminal of the last oscillation unit is connected with an input terminal of the first oscillation unit, and two output terminals of the last oscillation unit are connected with two input terminals of the comparator CMP respectively, that is an output terminal of the oscillation unit D1 is connected with an input terminal of the oscillation unit D2, and an output terminal of the oscillation unit D2 is connected with an input terminal of the oscillation unit D3, and an output terminal of the oscillation unit D3 is connected with an input terminal of the oscillation unit D1, thereby a closed loop is formed by the three oscillation units. And specific structures and principles of the oscillation units are well known by the skilled in the art (circuit diagrams are showed in FIG. 6), which are not described in detail. Furthermore, the clock Fout with stable frequency is outputted from an output terminal of the comparator CMP.

Figure 6:
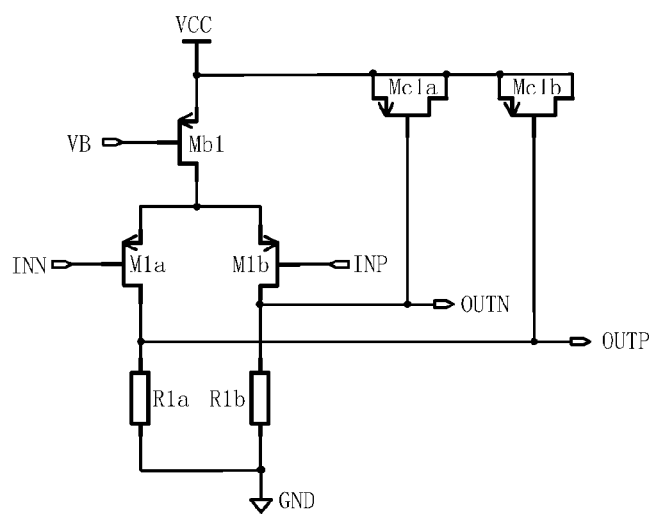
FIG. 6 is a circuit diagram of the oscillation unit according to the present invention.

Please refer to FIG. 5 and FIG. 6, in the ring oscillator, the thirteenth FET M13, the fourteenth FET M14, and the fifteenth FET M15 mirror and transmit the compensation current Icps to the oscillation units D1, D2, and D3, and then the oscillation units D1, D2, and D3 occur free oscillation, and finally a differential signal is outputted by the oscillation unit D3; and the comparator CMP converts the differential signal to the clock Fout and outputs it. And FETs M1a and M1b of each oscillation unit are input transistors which are matched with the ninth FET M9; the FET Mb1 is arranged for receiving mirrored compensation current Icps and offsetting the oscillation units; the FETs Mc1a and Mc1b are load capacitors, and the resistors R1a and R1b are load resistors. When used, in order to keep the frequency of the clock Fout outputted from the ring oscillator being unchanged, gm (transconductance) of each oscillation unit should be kept unchanged, that is gm of the FETs M1a and M1b of each oscillation unit should be unchanged, wherein gm can be expressed as:

$$gm = \sqrt{Cox * \text{up} * (W/L)_{1x} * Ib}.$$

To be noted, (W/L)1x means the width/length ratio of the FETs M1a and M1b, Ib refers to a current flowing through the FETs M1a and M1b, and if relationship between the width/length ratio (W/L)15 of the FET M15 and the width/length ratio (W/L)b1 of the FET Mb1 is set as (W/L)b1=2a*(W/L)15, then Ib=a*Icps, thereby the expression of gm is:

$$gm = \sqrt{Cox * \text{up} * (W/L)_1 * Ib}$$

$$= \sqrt{Cox * \text{up} * (W/L)_1 * a * Icps}$$

$$= \sqrt{Cox * \text{up} * (W/L)_1 * a * \varepsilon * (W/L)_{1x} * \frac{1}{Cox * \text{up}}}$$

-continued $$= \sqrt{(W/L)_1 * a * \varepsilon * (W/L)_{1x}}.$$

Since a and ε are constants, (W/L)1 and (W/L)1x are constant which are independent of process and temperature, thus gm is a constant, not changed with process and temperature of the FETs M1*a* and M1*b* belonging to the ring oscillator.

It can be seen from above that the high-precision oscillator in which both the process compensation and the temperature compensation are existed individually is provided, the both are adjustable due to one of them will not be influenced by the other; and frequency of its outputted clock is not influenced by process and temperature of the FETs in the ring oscillator, thereby precision of the outputted clock is improved.

While the present invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A high-precision oscillator, comprising:
a voltage reference module, and the voltage reference module comprising multiple measured Field Effect Transistors and arranged for detecting process corners for the measured Field Effect Transistors to generate a reference voltage which contains process corner information of the measured Field Effect Transistors;
a compensation current generating module, to which the reference voltage is inputted, to provide a temperature compensation for the reference voltage and generate a compensation current which includes both process compensation and temperature compensation; and
a ring oscillator, arranged for receiving the compensation current generated by the compensation current generating module, and then outputting a clock with stable frequency according to the compensation current;
wherein the voltage reference module comprises a first Field Effect Transistor, a second Field Effect Transistor, a third Field Effect Transistor, a fourth Field Effect Transistor, a fifth Field Effect Transistor, a sixth Field Effect Transistor, a seventh Field Effect Transistor, an eighth Field Effect Transistor, a first resistor and a second resistor; gates and drains of the first Field Effect Transistor, the second Field Effect Transistor and the third Field Effect Transistor are grounded, and a source of the first Field Effect Transistor is connected with a source of the seventh Field Effect Transistor, a source of the second Field Effect Transistor is connected with one terminal of the first resistor, a source of the third Field Effect Transistor is connected with one terminal of the second resistor, and the first Field Effect Transistor, the second Field Effect Transistor and the third Field Effect Transistor are the measured Field Effect Transistors so as to provide the process corner information of the Field Effect Transistors; sources of the fourth Field Effect Transistor, the fifth Field Effect Transistor and the sixth Field Effect Transistor are connected with an external power source, and their gates are jointly connected to a drain of the fifth Field Effect Transistor, a drain of the fourth Field Effect Transistor is connected with a drain of the seventh Field Effect Transistor, a drain of the fifth Field Effect Transistor is connected with a drain of the eighth Field Effect Transistor, and a drain of the sixth Field Effect Transistor is connected with the other terminal of the second resistor to output the reference voltage; a gate and a drain of the seventh Field Effect Transistor are connected together which are also connected with a gate of the eighth Field Effect Transistor, and a source of the eighth Field Effect Transistor is connected with the other terminal of the first resistor.

2. The high-precision oscillator according to claim 1, wherein a width/length ratio of the fifth Field Effect Transistor is the same as that of the sixth Field Effect Transistor.

3. The high-precision oscillator according to claim 1, wherein the compensation current generating module comprises a ninth Field Effect Transistor, a tenth Field Effect Transistor, an eleventh Field Effect Transistor, a twelfth Field Effect Transistor, and an operational amplifier; a gate and a drain of the ninth Field Effect Transistor are grounded, a source of the ninth Field Effect Transistor is connected with an inverting input terminal of the operational amplifier and a source of the tenth Field Effect Transistor respectively; and a non-inverting input terminal of the operational amplifier is connected with an output terminal of the voltage reference module, and an output terminal of the operational amplifier is connected with a gate of the tenth Field Effect Transistor; a drain of the tenth Field Effect Transistor, and a drain and a gate of the eleventh Field Effect Transistor are jointly connected to a gate of the twelfth Field Effect Transistor; sources of the eleventh Field Effect Transistor and the twelfth Field Effect Transistor are connected with the external power source; and the compensation current which includes both the process compensation and the temperature compensation is outputted from a drain of the twelfth Field Effect Transistor.

4. The high-precision oscillator according to claim 3, wherein the width/length ratio of the eleventh Field Effect Transistor is the same as that of the twelfth Field Effect Transistor.

5. The high-precision oscillator according to claim 1, wherein the compensation current generating module comprises a ninth Field Effect Transistor, a tenth Field Effect Transistor, an eleventh Field Effect Transistor, a twelfth Field Effect Transistor, and an operational amplifier; a gate and a drain of the ninth Field Effect Transistor are grounded, a source of the ninth Field Effect Transistor is connected with an inverting input terminal of the operational amplifier and a source of the tenth Field Effect Transistor; and a non-inverting input terminal of the operational amplifier is connected with an output terminal of the voltage reference module, and an output terminal of the operational amplifier is connected with a gate of the tenth Field Effect Transistor; a drain of the tenth Field Effect Transistor, and a drain and a gate of the eleventh Field Effect Transistor are jointly connected to a gate of the twelfth Field Effect Transistor; sources of the eleventh Field Effect Transistor and the twelfth Field Effect Transistor are connected with the external power source; and the compensation current is outputted from a drain of the twelfth Field Effect Transistor; and the ninth Field Effect Transistor, the first Field Effect Transistor, the second Field Effect Transistor and the third Field Effect Transistor are P-type Field Effect Transistors.

6. The high-precision oscillator according to claim 1, wherein the ring oscillator comprises a thirteenth Field Effect Transistor, a fourteenth Field Effect Transistor, a fifteenth Field Effect Transistor, a comparator and multiple oscillation units; a drain and a gate of the thirteenth Field Effect Transistor, and a gate of the fourteenth Field Effect Transistor are jointly connected to an output terminal of the compensation current generating module, sources of the thirteenth Field Effect Transistor and the fourteenth Field Effect Transistor are grounded; a drain of the fourteenth Field Effect Transistor is connected with a drain of the fifteenth Field Effect Transistor; the drain and a gate of the fifteenth Field Effect Transistor are jointly connected to each oscillation unit, and a source of the fifteenth Field Effect Transistor is connected with the external power source; all the oscillation units are connected in series in order, and an output terminal of the last oscillation unit is connected with an input terminal of the first oscillation unit, and two output terminals of the last oscillation unit are connected with two input terminals of the comparator respectively, and the clock with stable frequency is outputted from an output terminal of the comparator.

7. A high-precision oscillator, comprising:
   a voltage reference module, and the voltage reference module comprising multiple measured Field Effect Transistors and arranged for detecting process corners for the measured Field Effect Transistors to generate a reference voltage which contains process corner information of the measured Field Effect Transistors;
   a compensation current generating module, to which the reference voltage is inputted, to provide a temperature compensation for the reference voltage and generate a compensation current which includes both process compensation and temperature compensation; and
   a ring oscillator, arranged for receiving the compensation current generated by the compensation current generating module, and then outputting a clock with stable frequency according to the compensation current;
   wherein the compensation current generating module comprises a ninth Field Effect Transistor, a tenth Field Effect Transistor, an eleventh Field Effect Transistor, a twelfth Field Effect Transistor, and an operational amplifier; a gate and a drain of the ninth Field Effect Transistor are grounded, a source of the ninth Field Effect Transistor is connected with an inverting input terminal of the operational amplifier and a source of the tenth Field Effect Transistor respectively; and a non-inverting input terminal of the operational amplifier is connected with an output terminal of the voltage reference module, and an output terminal of the operational amplifier is connected with a gate of the tenth Field Effect Transistor; a drain of the tenth Field Effect Transistor, and a drain and a gate of the eleventh Field Effect Transistor are jointly connected to a gate of the twelfth Field Effect Transistor; sources of the eleventh Field Effect Transistor and the twelfth Field Effect Transistor are connected with the external power source; and the compensation current which includes both the process compensation and the temperature compensation is outputted from a drain of the twelfth Field Effect Transistor.

* * * * *